United States Patent [19]
Meeker et al.

[11] 3,979,671
[45] Sept. 7, 1976

[54] TEST FIXTURE FOR USE IN A HIGH SPEED ELECTRONIC SEMICONDUCTOR CHIP TEST SYSTEM

[75] Inventors: Robert G. Meeker, Wappingers Falls; William J. Scanlon, Hopewell Junction; Zvi Segal, Wappingers Falls, all of N.Y.

[73] Assignee: International Business Machines Corporation, Armonk, N.Y.

[22] Filed: Mar. 6, 1975

[21] Appl. No.: 555,766

[52] U.S. Cl. .............................................. 324/158 F
[51] Int. Cl.² ......................................... G01R 31/26
[58] Field of Search......... 324/158 F, 158 D, 158 P; 29/574; 269/21

[56] References Cited
UNITED STATES PATENTS 3,437,929  4/1969  Glenn .............................. 324/158 F
3,803,489  4/1974  Miller ............................. 324/158 D Primary Examiner—R. V. Rolinec
Assistant Examiner—Ernest F. Karlsen
Attorney, Agent, or Firm—Wesley DeBruin

[57] ABSTRACT

The invention relates to apparatus for the testing of high circuit density devices fabricated by large scale integration techniques. More specifically, the invention is directed to a test fixture used in a test system for determining the merit or electrical integrity of small semiconductor chips, diced from a semiconductor wafer having a large number of chips. Each chip being a high circuit density device, e.g., a small monolithic semiconductor structure having a large number of closely spaced circuits thereon and therein.

4 Claims, 1 Drawing Figure

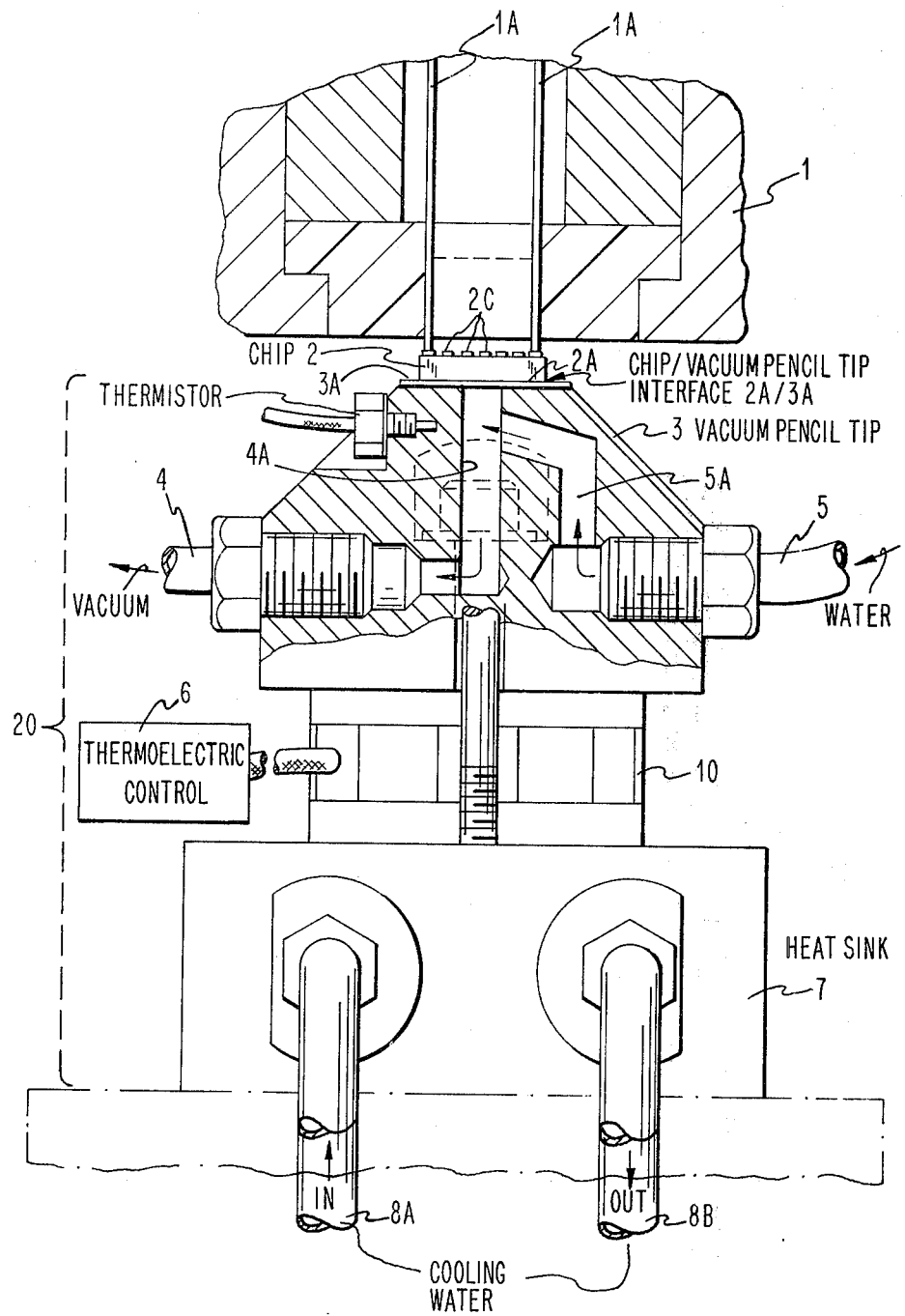

TEST FIXTURE FOR USE IN A HIGH SPEED ELECTRONIC SEMICONDUCTOR CHIP TEST SYSTEM

There has been and is a growing trend in the semiconductor industry for increased circuit density. This trend has resulted in an increased circuit density. This trend has resulted in an increase in volumetric heat generation and concurrent decrease in available heat transfer surface when devices are tested in a chip form. These highly dense devices may dissipate in the order of five watts or more of energy during the electrical testing operation.

A primary and critical problem with testing chips in chip form is the wide temperature fluctuations which can affect test results because of the thermal-electrical relationships of the devices. This wide temperature variation is caused by the high thermal resistance of the chip (in °C/watt) and the power input variations during test.

Testing chips in wafer form has the advantage of low thermal resistance due to effective conductance of heat to adjacent chips on the wafer. This low thermal resistance minimizes the affect of power input variations and yields acceptable temperature variations when chips are tested in wafer form. The disadvantage of wafer test is that additional process steps have to take place after the testing operation. These additional process steps, such as the dicing operation, have some yield associated with them. This yield loss will have a dramatic affect on the final yield of the module which consists of multiple chips.

The test fixture of the invention enables the testing of devices in chip form by injecting liquid at the vacuum pencil chip interface thereby reducing the thermal resistance of the chip. This reduction in the thermal resistance of the chip is due to the reduction in thermal contact resistance at the chip/pencil interface surface. The mechanism of contact resistance consists of conduction through the solid to solid spots at the interface, and the conduction through the entrapped gasses in the asperities created by the contact. It is the second factor that represents the major resistance to heat flow since the thermal conductivity of the gas is quite small in comparison with that of the solids (224 for copper compared to 0.013 for air). By introducing water at the pencil/chip interface the water flows by capillary action to fill the air asperities. The conductivity of water (0.3 BTU/Hr-ft-°F) is 23 times that of air. Thus a more effective method of removing the heat at the interface surface and a reduction in the overall thermal resistance of the chip is achieved.

In a test system for testing micro-miniature devices, a test fixture is used to support and maintain in alignment a micro-miniature device under test with a probe structure. More particularly, where said micro-miniature device is a chip of monolithic material containing a plurality of circuits and having first and second substantially planar surfaces. Said first planar surface of said chip containing a densely spaced array of conductive pads for making electrical connection to the circuits within said chip. Said test fixture including a substantially planar surface on which said chip is supported and maintained in alignment with the probe structure of said test system, whereby a physical interface is formed between said second planar surface of said device under test and said substantially planar surface of said test fixture. The improvement comprising means and method for controllably and selectively introducing a liquid, preferably water, into the physical interface between said test fixture and said device under test, whereby the thermal resistance of the chip under test is reduced due to the reduction in thermal contact resistance at the chip/test fixture interface.

The above ABSTRACT is not to be taken either as a complete exposition or as a limitation of the present invention, the full nature and extent of the invention being discernible only by reference to and from the entire disclosure.

Reference to Pending U.S. Patent

Applications, Patents and Publications

The test fixture of the present invention may be employed in a test system generally of the type disclosed in Ser. No. 394,712, filed Sept. 6, 1973, granted as U.S. Pat. No. 3,916,306 on Oct. 28, 1975, entitled, "Method and Apparatus for Testing High Circuit Density Devices", by M. J. Patti and of common assignee herewith.

The test fixture of the present invention may be employed in a test system generally of the type disclosed in Ser. No. 410,592, filed Oct. 29, 1973, granted as U.S. Pat. No. 3,873,818 on Mar. 25, 1975, entitled, "Electronic Tester for Testing Devices Having a High Circuit Density", by J. D. Barnard and of common assignee herewith.

The test fixture of the present invention may be employed in a test system with a probe structure generally of the type disclosed in U.S. Pat. No. 3,806,801 granted Apr. 23, 1974, to R. Bove, on "Probe Contactor Having Buckling Beam Probes" and of common assignee herewith.

The test fixture of the present invention may be employed in a test system with a Coaxial Array Space Transformer generally of the type disclosed in Ser. No. 484,052, filed June 28, 1974, granted as U.S. Pat. No. 3,911,361 on Oct. 7, 1975, entitled "Coaxial Array Space Transformer" by R. Bove et al and of common assignee herewith.

As will be more fully apparent from the detailed description of the invention set-forth hereinafter, applicants' invention may be practiced by employing a suitably modified precision vacuum chuck generally of the type disclosed in the following publications: (1) "Chuck Elevator" by R. M. Gustafson, IBM Technical Disclosure Bulletin, Vol. 17, No. 1, June 1974, pages 109 and 110; (2) "Precision Mechanism for Use in a System Requiring Precise Alignment" by R. E. Hogan et al., IBM Technical Disclosure Bulletin, Vol. 17, No. 3, August 1974, pages 880 and 881; and (3) "High-Resolution X, Y, Z, θ Mechanism" by Z. Segal et al., IBM Technical Disclosure Bulletin, Vol. 17 No. 7, December 1974, pages 1961 and 1962.

BACKGROUND OF THE INVENTION AND PRIOR ART

Applicants' invention is directed to a test fixture for maintaining the temperature of a device under test within predetermined limits when said device is subjected to a relatively sizeable amount of electrical energy for test purposes.

Numerous structures and techniques have been employed in the art for the cooling of electronic devices including semiconductor devices. The structures of the prior art are extensive and varied. Many of the structures of the prior art employ a liquid coolant. Particularly, well-known to the art and commonly employed is a heat sink fabricated from a metal, such as copper, having the ability to efficiently conduct energy in the form of heat. Many of these heat sinks have provision for passing a coolant liquid through the heat sink for maintaining the heat sink within a predetermined temperature range.

It is also well-known in the art to submerge an electronic component or device in a suitable coolant liquid. It is also well-known in the art to provide control apparatus for controlling the flow of coolant in a heat sink or bath.

In U.S. Pat. No. 3,007,088, granted to E. J. Diebold on Oct. 31, 1961, a rectifier such as a crystal junction rectifier utilizing a germanium or silicon wafer as a rectifying medium, is clamped to a fluid-cooled bus bar. A heat-conductive and electrically conductive grease, for example silicone grease, is provided between the lower base block (lower cathode contact) and the liquid cooled bus bar. The silicone grease under pressure fills voids which may exist between opposing surfaces which are not perfectly smooth. Heat transfer from the base block to the bus bar is thereby improved by virtue of the direct contact of the grease with portions of opposing surfaces which may not otherwise make direct contact. The tightening down of flanges by means of bolts puts the grease under high pressure.

In U.S. Pat. No. 3,648,167, granted to D. R. Purdy et al. on Mar. 7, 1972 fluid cooled apparatus for testing power semiconductor devices is disclosed. The apparatus includes a base member having a major surface and a cavity within the base member. The surface of the base member has an aperture which communicates with the cavity. The apparatus further includes means for holding the power semiconductor device in the aperture, so that an outer heat transfer surface of the device is exposed in the cavity. Additionally, the apparatus includes means for circulating a fluid through the cavity and across the heat transfer surface; and means in the cavity for controlling the circulating fluid so as to minimize the thermal resistance between the fluid and the heat transfer surface.

In U.S. Pat. No. 3,492,535, granted to D. L. Behrendt on Jan. 27, 1970 entitled "Ceramic Circuit Card", a thermally conductive compound is employed between the surfaces of the ceramic circuit card and the modules mounted thereon. The circuit card is comprised of an alumina ceramic substrate card with a multilayer pattern of conductors on one surface and a conductive plane on the opposing surface. Pads formed on circuit sites by increasing the lateral dimension of a conductor, are connected by the conductive pattern and a conductive layer about the edge of the substrate card to the plane on the opposing surface. The heat from the thermal emitting circuit modules mounted on the pads with a conductive thermal compound therebetween, is circulated away from the modules by the connecting path.

In U.S. Pat. No. 3,842,346, granted to C. R. Bobbitt on Oct. 15, 1974, entitled "Continuity Testing of Solid State Circuitry During Temperature Cycling", water is used to cool the heat sink for the thermoelectric devices. The thermoelectric devices are formed as flat plates which are assembled to be individually replaceable and are capable of cycling in two minutes or less from approximately 25° to 100°C and back to 25°C.

In U.S. Pat. No. 3,761,808, granted to R. B. Ryan on Sept. 25, 1973 entitled "Testing Arrangement", the temperature of a device under test (packaged integrated circuit) is controlled by controlling the temperature of the fluid bath in which the device under test is submerged.

In U.S. Pat. No. 3,150,021, granted to A. Sato on Sept. 22, 1964, entitled "Method of Manufacturing Semiconductor Devices", the desired characteristics of a tunnel diode are achieved by manufacturing the tunnel diodes with a slightly oversized junction area. The tunnel diodes are then placed in a chemical etching bath which etches away edges of the junction area while simultaneously measuring the capacitance across the junction.

In U.S. Pat. No. 3,794,912, granted to P. J. W. Severin et al. on Feb. 26, 1974, entitled "Contact Device Using Conductive Fluid Measuring Resistance and Capacitance of Semiconductor", a liquid electrical contact is made with a semiconductor disk by forcing the liquid through an opening contained in the structure on which the disc is supported.

In U.S. Pat. No. 3,803,489, granted to G. L. Miller on Apr. 9, 1974, entitled "Liquid Contacts for Use in Semiconductor Profile Analysis", semiconductor doping profile apparatus of the type using current feedback for maintaining a constant modulation parameter is disclosed. Non-destructive analysis is achieved by using a liquid electrode rectifying contact for forming each required diode region. A metal electrode contacts the electrolyte and is surrounded by an annular guard ring maintained at rf ground, which defines precisely the area of the diode region.

U.S. Pat. No. 3,811,182, granted to W. J. Ryan et al. on May 21, 1974, entitled "Object Handling Fixture, System and Process" and of common assignee with the instant application, discloses vacuum controlled chip handling apparatus.

In the IBM Technical Disclosure Bulletin publication, entitled "Cooling System for an Integrated Circuit Tester", by R. C. Chu et al., Vol. 13, No. 11, April 1971, page 3547, a test chuck is provided into which the component to be tested is loaded. A reservoir is connected to the chuck by conduits. The reservoir can be raised and lowered. When the reservoir is raised, the liquid level is raised above the chuck so that the fluid fills the chuck by gravitational flow and provides the boiling type cooling for the electronic component located therein.

In the IBM Technical Disclosure Bulletin publication, entitled "High-Temperature Chip Handler" by M. J. Mulligan, Vol. 14, No. 4, September 1971, a conduction heated vacuum pencil is disclosed for incorporation into a chip handler for preheating semiconductor chips.

In the IBM Technical Disclosure Bulletin publication, entitled "Test Chamber with Seal and Boot", a test chamber used in testing substrates populated with integrated circuit chips is disclosed. The testing takes place in a liquid cooled environment to prevent device burnout and to minimize the possibility of contaminating the product and the coolant liquid.

SUMMARY OF THE INVENTION

In a high speed electronic system for testing monolithic semiconductor chips fabricated by large scale integration techniques, wherein said semiconductor chips have a first substantially planar surface and a second substantially planar surface containing an array of conductive pads thereon, a probe structure for contacting said conductive pads on said chip, positioning apparatus for positioning said chip with respect to said probe structure, said position apparatus including a precision controllable vacuum chuck having a vacuum pencil tip terminating in a planar surface for engaging said first planar surface of said chip wherein the improvement comprises: said chip positioning apparatus further including means for introducing a controlled amount of a liquid between the interface of the planar surface of said vacuum chuck and said first planar surface of said semiconductor chip under test, whereby the thermal contact resistance at the chip/vacuum chuck interface is reduced.

In a method for testing a semiconductor chip having a number of circuits fabricated therein, said method employing at least a vacuum chuck and a probe structure, said method including the steps of (a) employing said vacuum chuck to align and position said chip with respect to said probe structure for making electrical contact with said circuits, and whereby a physical interface exists between said chip and said vacuum chuck; (b) wherein the improvement comprises the step of introducing a liquid in the interface between said vacuum chuck and said chip; (c) utilizing said probe structure to subject said circuits on said chip to electrical test conditions; whereby the temperature of said chip under test is maintained within a predetermined range during the testing of said chip due substantially to said liquid reducing the thermal resistance at the interface between said vacuum chuck and said chip.

It is a primary object of this invention to provide an improved test fixture for use in a high speed test system wherein the densely spaced circuitry on semiconductor chips diced from a semiconductor wafer fabricated by large scale integration techniques is rapidly and accurately tested.

It is a primary object of this invention to provide an improved test fixture for use in a high speed integrated circuit chip test system wherein said fixture includes means for maintaining the temperature of said chip under test within a predetermined temperature range.

It is a primary object of the invention to provide an improved test fixture for use in semiconductor chip test system, wherein means is provided for reducing the thermal contact resistance between the chip/vacuum pencil tip interface.

It is a primary object of the invention to provide an improved test fixture for use in a semiconductor chip test system, where said test fixture includes a planar surface of heat conductive material on which said chip under test is supported and said test fixture being characterized by the provision of means for injecting a liquid, for example, water, into the physical interface existing between said chip under test and said planar surface of heat conductive material.

It is a further primary object of the invention to provide an improved method of testing semiconductor chips having a relatively sizeable number of circuits fabricated therein, wherein the improvement comprises the step of introducing a liquid, preferably water, to fill the voids between a substantially planar surface of the chip under test and the substantially planar surface of a test fixture on which said chip under test is supported during the testing thereof, whereby the temperature rise of said chip under test is maintained within a predetermined increment per watt of energy impressed on said chip under test.

The foregoing and other objects, features and advantages of the invention will be more apparent from the following more particular description of the preferred embodiments of the invention, as illustrated in the accompanying drawing.

In the drawing:

The FIGURE discloses an orthogonal view of a test fixture in accordance with the preferred embodiment of the invention. The view of the test fixture is partially in section. In addition to the test fixture a semiconductor chip and a probe structure are schematically illustrated.

PREFERRED EMBODIMENT

The FIGURE shows a vacuum chuck, or a vacuum pencil assembly 20 which includes a vacuum pencil tip 3, a thermoelectric module 10 to control the temperature of the pencil, and a heat sink 7. The heat sink 7, as depicted by conduits 8A and 8B has water as a coolant circulating therethrough. As is well known in the art the thermoelectric module 10 and the thermoelectric control 6 maintain the vacuum pencil tip 3 at a predetermined temperature. The thermoelectric control module 10 and the thermoelectric control 6 may respectively be any of a number of suitable commercially available components. For example, a suitable thermoelectric control module 10 and control 6 are available from the Cambion Division of Cambridge Thermionic Co., Cambridge, Massachusetts. The vacuum pencil tip 3 is constructed from a material, such as the metal copper, having high thermal conductivity. Contained within the vacuum pencil tip is a thermistor. The thermistor communicates with the thermoelectric control 6. The vacuum pencil tip 3 includes a planar surface 3A. Communicating with the planar surface 3A of the vacuum pencil tip are the vacuum port 4, 4A and the water port 5, 5A.

Still referring to the FIGURE, a portion of a probe structure 1 is depicted. The probe structure may be generally of the type disclosed and claimed in the aforeidentified U.S. Pat. No. 3,806,801. The probe structure 1 includes a plurality of discrete electrical probes 1A oriented in an array corresponding to the array of conductive pads 2C of semiconductor chip 2. The semiconductor chip 2 is an integrated circuit chip diced from a semiconductor wafer prior to testing. The chip 2 may be essentially square and have a dimension in the order of 100 to 200 mils. As will be appreciated, by persons skilled in the art, applicants' invention is not limited to any particular chip size or configuration, other than the fact that the practice of applicants' invention has particular utility and advantage in the testing of relatively very small high circuit density semiconductor chips. The chip 2 has a lower planar surface 2A which rests upon the planar surface 3A of vacuum pencil tip 3. The chip 2 has on its upper (second) planar surface the array of conductive pads 2C. (Merely as an example, a 170 mil × 170 mil chip may have well over 100 discrete pads arranged in an array on a planar surface thereof). The conductive pads are provided to permit electrical connection of the circuits within the chip to circuitry external to the chip. For example, certain of the pads on the chip may be termed input-/output pads, as their functions are to provide inputs to the chip circuitry (input pads) and to receive outputs from chip circuitry (output pads). Others of the pads may be termed power pads as their primary purpose is to provide electrical energy to the chip circuitry.

In a test system of the type known to the art, each of the probes 1A of the probe structure electrically contacts a discrete one of said array of pads. The system provides, via the probe structure, power supply potentials to the device under test. The test system further provides under control of a test program appropriate input signals, via the probe structure, to the device under test. Further the test system, via the probe structure, accepts outputs from the device under test. These outputs are compared with known acceptable outputs by the test system as a basis for determining the merit or lack of merit of the device under test. No further and detail discussion of an electronic test system for testing semiconductor devices is deemed necessary in that the practice of applicants' invention is not limited to a particular test system.

Further, any one of numerous test systems known to the art may be employed to practice applicants' invention. For example, applicants' invention may be practiced in a test system generally of the type disclosed and claimed in the afore-identified M. J. Patti, U.S. Pat. No. 3,916,306 or the afore-identified J. D. Barnard U.S. Pat. No. 3,873,818.

In a test system a typical test cycle will include the following sequence. The chip 2 is aligned on the vacuum pencil tip surface 3A with the aid of an optical system and servo mechanism. (The optical system and the servo system are not shown in the drawing nor is a detail discussion thereof deemed necessary. Persons skilled in the testing art are highly conversant with suitable optical and servo systems. The optical and servo system "per se" form no portion of applicants' invention). After the chip is aligned the probes 1A of probe structure 1 are brought into physical contact with the pads 2C of the chip under test. After contact is established between the probe structure and chip 2 a liquid, preferably water, is introduced into the chip/vacuum pencil tip interface 2A/3A. It is to be appreciated that the volume of water introduced is very limited. The volume of water introduced, however, must be sufficient to flow by capillary action to fill all the air asperities at the interface surface without any appreciable overspilling of the water. A suitable sequence for introducing the water into the interface is, after turning off the vacuum 4, introduce a predetermined volume of water. The volume of water will be such as to fill ducts 4A and 5A, provide an adequate amount of water for filling by capillary action the voids, or air asperities existing between surface 2A of chip 2 and surface 3A of the vacuum pencil tip 3. A limited amount of spillage of the water from the interface may be tolerated. It will be appreciated that the predetermined volume of water introduced will be a function of the volume of the ports 4A and 5A as well as the volume of the voids in the interface. It has been found that in the order of one drop of water will fill the voids in the interface between the chip and vacuum pencil.

As will be apparent to persons skilled in the art, the practice of applicants' invention is not limited to the structure depicted in the FIGURE. For example, the invention may be practiced by structure generally of the type depicted in the FIGURE and wherein the vacuum pencil assembly 20 is super imposed over the probe structure 1.

As will be apparent, the probes 1A may be brought into contact with the pads 1C by relative movement between the probe structure 1 and vacuum pencil assembly 20.

SUMMARY OF THE INVENTION

There has been a growing trend in the semiconductor industry for increased circuit density. This trend has resulted in an increase in volumetric heat generation and concurrent decrease in available heat transfer surface.

When devices are tested in wafer form the temperature variations of the device due to the power input variations is low enough not to cause any appreciable concern at the testing operation. The low temperature variation is due primarily to the thermal conductivity of the semiconductor wafer. The thermal conductivity is sufficiently high so that effectively the surrounding chips act as an extended surface and thereby lower the thermal resistance of the device under test.

When devices are tested in chip form, the heat flow is primarily through the vacuum pencil. Due to the poor heat flow path out of the device, higher thermal resistance of the chips have resulted. This causes wider temperature fluctuations. These wider temperature variations can shift the test limits to such a degree that device under test in chip form is not feasible. Inability to adequately control the temperature of the device under test in a chip form has been a severe problem in the semiconductor testing art. Applicants' invention addresses and provides a solution to this problem.

The practice of applicants' invention provides a technique for testing discrete chip devices where the temperature rise is of the same magnitude as that experienced in testing devices in wafer form. The temperature rise is less than 2°C/watt for a 0.180 inch × 0.180 inch chip.

While the invention has been described and shown particularly with reference to one of its preferred embodiments, it will be understood by those skilled in the art to which the work is directed that various changes in form and detail may be made without departing from either the spirit or scope of the invention.

What is claimed is:

1. In a high speed electronic system for testing monolithic semiconductor chips fabricated by large scale integration techniques, wherein said semiconductor chips have a first substantially planar surface and a second substantially planar surface containing an array of conductive pads thereon, a probe structure for contacting said conductive pads on said chip, positioning apparatus for positioning said chip with respect to said probe structure, said position apparatus including:

a precision controllable vacuum chuck having a vacuum pencil tip terminating in a planar surface for engaging said first planar surface of said chip;

wherein the improvement comprises, said chip positioning apparatus including further means for introducing a controlled amount of a liquid between the interface of the planar surface of said vacuum chuck and said first planar surface of said semiconductor chip under test, whereby the thermal contact resistance at the chip/vacuum chuck interface is reduced.

2. In a high speed electronic system for testing monolithic semiconductor chips as recited in claim 1, wherein said liquid is water, and said controlled amount of water is controlled to completely fill the voids existing between the planar surface of said vacuum pencil tip and said first planar surface of said chip.

3. In a method for testing a semiconductor chip having a number of circuits fabricated therein, said method employing at least a vacuum chuck and a probe structure, said method including the steps of
a. employing said vacuum chuck to align and position said chip with respect to said probe structure for making electrical contact with said circuits, and whereby a physical interface exists between said chip and said vacuum chuck;
b. wherein the improvement comprises the step of introducing a liquid in the interface between said vacuum chuck and said chip;
c. utilizing said probe structure to subject said circuits on said chip to electrical test conditions;
whereby the temperature of said chip under test is maintained within a predetermined range during the testing of said chip due substantially to said liquid reducing the thermal resistance at the interface between said vacuum chuck and said chip.

4. In a method for testing semiconductor chip having a number of circuits fabricated therein, as recited in claim 3, wherein said liquid is water and the volume of water introduced is limited in volume to substantially the amount required to completely fill the voids existing between the planar surfaces forming said interface.

* * * * *